United States Patent [19]

Hasegawa

[11] Patent Number: 5,895,727
[45] Date of Patent: Apr. 20, 1999

[54] MAGNETORESISTIVE MULTILAYER FILM

[75] Inventor: Naoya Hasegawa, Niigata-ken, Japan

[73] Assignee: Alps Electric Co., Ltd., Tokyo, Japan

[21] Appl. No.: 08/887,368

[22] Filed: Jul. 2, 1997

Related U.S. Application Data

[62] Division of application No. 08/730,278, Oct. 15, 1996.

[30] Foreign Application Priority Data

Oct. 16, 1995 [JP] Japan ................................ 7-267314

[51] Int. Cl.$^6$ .............................. B32B 9/00; G11B 5/66; B22D 25/00
[52] U.S. Cl. .............. 428/692; 428/694 R; 428/694 T; 428/694 TS; 428/694 TM; 428/610
[58] Field of Search ................... 428/694 R, 694 T, 428/694 TS, 694 TM, 692, 610; 420/435, 501, 89, 94, 95, 119, 441, 8, 469, 485, 487, 496; 148/304, 305, 313, 315, 306, 312

[56] References Cited

U.S. PATENT DOCUMENTS

| | | | |
|---|---|---|---|
| 4,284,440 | 8/1981 | Tokunaga et al. | 148/31.57 |
| 4,473,400 | 9/1984 | Hoselitz | 73/123 |
| 4,881,989 | 11/1989 | Yoshizawa et al. | 148/302 |
| 4,985,089 | 1/1991 | Yoshizawa et al. | 148/303 |
| 5,069,731 | 12/1991 | Yoshizawa et al. | 148/305 |
| 5,151,137 | 9/1992 | Yoshizawa et al. | 148/313 |
| 5,246,480 | 9/1993 | Haufe et al. | 75/236 |
| 5,304,258 | 4/1994 | Ishiwata et al. | 148/306 |
| 5,425,819 | 6/1995 | Oohashi et al. | 148/300 |
| 5,573,863 | 11/1996 | Hayakawa et al. | 428/694 T |
| 5,585,196 | 12/1996 | Inoumata et al. | 428/557 |
| 5,725,685 | 3/1998 | Hayakawa et al. | 148/306 |
| 5,750,273 | 5/1998 | Inoue et al. | 428/692 |

OTHER PUBLICATIONS

A.E. Berkowitz, et al, "Giant Magnetoresistance in Heterogeneous Cu–Co Alloys", *The American Physical Society*, Jun. 22, 1992, vol. 68, No. 25, pp. 3745–3748.

John Q. Xiao, et al., "Giant Magnetoresistance in Nonmultilayer Magnetic Systems", *The American Physical Society*, Jun. 22, 1992, vol. 68, No. 25, pp. 3749–3752.

M.N. Baibich, et al. "Giant Magnetoresistance of (001) Fe/(001) Cr Magnetic Superlattices," *The American Physical Society*, Nov. 21, 1988, vol. 61, No. 21.

D.H. Mosca, F. Petroff, A.Fert, "Oscillatory Interlayer Coupling And Giant Magnetoresistance in Co/Cu Multilayers," *Elsevier Science Publishers B.V.* 1991, pp. L1–L5.

Shufeng Zhang, "Theory of Giant Magnetoresistance In Magnetic Granular Films," *American Institute of Physics*, Oct. 12, 1992, pp. 1855–1857.

*Primary Examiner*—Nam Nguyen
*Assistant Examiner*—Steven H. VerSteeg
*Attorney, Agent, or Firm*—Brinks Hofer Gilson & Lione

[57] ABSTRACT

A magnetoresistive material of the present invention has a structure in which many clusters are surrounded by a crystal phase of Cu and/or Ag, where each cluster has a grain size of 20 nm or less and composed of an amorphous phase containing at least one ferromagnetic metal element T as a main component selected from Fe, Co and Ni, and at least one element M selected from Ti, Zr, Hf, V, Nb, Ta, Mo and W.

1 Claim, 8 Drawing Sheets

FIG. I
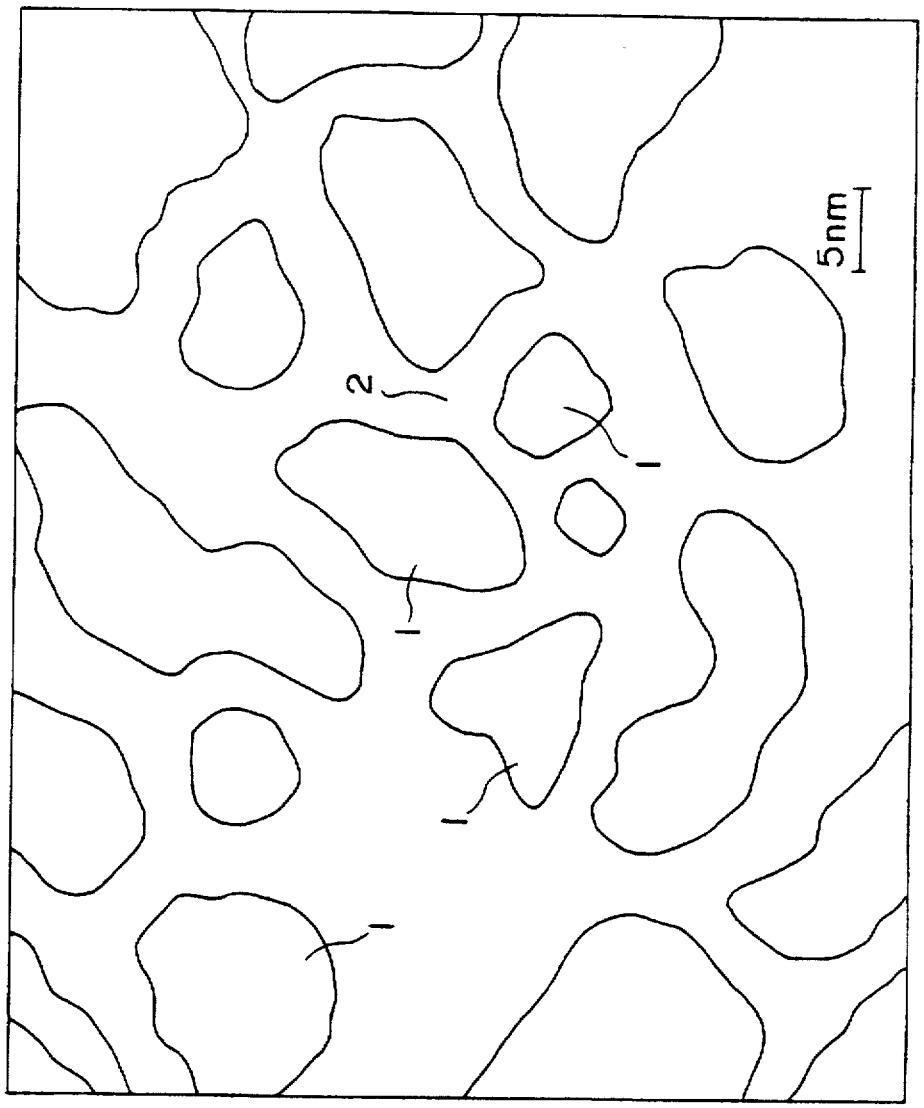

1

MAGNETORESISTIVE MULTILAYER FILM

This application is a division of application Ser. No. 08/730,278, filed Oct. 15, 1996 pending.

BACKGROUND OF THE INVENTION

1. Field of the Invention

The present invention relates to materials for magnetoresistive sensors used for a magnetic head, particularly a reproducing head, a position sensor, and an angle sensor.

2. Description of the Related Art

Although a Ni—Fe alloy thin film (permalloy thin film) is conventionally used as a magnetoresistive (MR) material, the permalloy film has a rate of change in resistance of 2 to 3%. In the future, in order to comply with the requirements to narrow the track of a magnetic head and increase the resolution of a magnetic sensor, a magnetoresistive material having a higher rate of change in resistance (MR ratio) is demanded.

The phenomenon referred to as "giant magnetoresistive (GMR) effect" has recently been found in Fe/Cr or Co/Cu multilayer thin films (refer to M. N. Baibich et al., Physical Review Letters, Vol. 61 (1988), p2472, D. H. Mosca et al., Journal of Magnetism and Magnetic Materials, Vol. 94 (1991), p L1). It is considered that, in such thin films, spin-dependent scattering caused by conduct electrons located in the interface between Fe and Cr or Co and Cu contributes to the giant magnetoresistive effect. These films basically differ from conventional Ni—Fe thin films in the generation mechanism of the magnetoresistive effect. Although a MR ratio of 10% or more is obtained from these thin films, the need for the films to have a multilayer structure complicates the production process therefor.

Thereafter, the same giant magnetoresistive effect was observed in a single-layer thin film in which ultrafine Co, Fe or Ni grains (grain size: a few nm) are precipitated in a Cu or Ag matrix, as shown in FIG. 6 for prior art using Co, refer to A. E. Berkowitz et al., Physical Review Letters, Vol. 68 (1992), p3745, J. Q. Xiao et al., Physical Review Letters, Vol. 68 (1992), p3749).

In these materials, the interfaces of Co grains and the Cu(Ag) matrix contribute to the giant magnetoresistive effect. Therefore, if the number of the Co grains precipitated can be increased while maintaining the size of ultrafine grains, i.e., if the Co content can be increased, the MR ratio is increased due to an increase in the total area of the interfaces. FIG. 7 shows changes in the rate of change in resistance (MR ratio) with the volume fraction of ferromagnetic grains. The changes can be theoretically predicted with a constant grain size (refer to O. Zhang et al., Applied Physics Letters, Vol. 61 (1992), p1855).

A conventional Cu—Co alloy has the tendency that the grain size increases as the Co content increases.

There is also the tendency that the rate of change in resistance decreases as the grain size of ferromagnetic Co grains increases, as shown in a theoretical curve of FIG. 8 (refer to S. Zhang et al., Applied Physics Letters, Vol. 61 (1992), p1855).

Because an increase in the Co (ferromagnetic material) content results in increased grain size, and increased grain size results in decreased resistance, it is therefore impossible to improve the giant magnetoresistive effect by only increasing the amount of Co (ferromagnetic material).

FIG. 9 shows the Co-content dependence of the rate of change in resistance (MR ratio) of a Cu—Co alloy sputtered thin film. FIG. 9 indicates that the rate of change in resistance has a peak at the Co content of about 20 at %, and decreases as the Co content increases from about 20 at %.

There is also a problem in that if the grain size of ferromagnetic grains increases, the magnetization process is governed by the crystal magnetic anisotropy of the ferromagnetic grains, thereby increasing hysteresis.

Such a granular GMR material also has another problem with an alloy having a high Cu or Ag content (a low content of ferromagnetic metal) in that, since the respective ferromagnetic grains are spaced and thus magnetically separated, the alloy exhibits a superparamagnetic behavior and a gradual change in magnetization with an external magnetic field, and magnetization is thus slowly saturated. Namely, such an alloy requires a very high magnetic field (saturation magnetic field Hs) for saturation of the resistance change, which is defined as shown in FIG. 10.

Since electric resistance depends upon the relative angle between adjacent ferromagnetic grains with a nonmagnetic matrix therebetween, an overall change in magnetization with an external magnetic field corresponds to a change in electric resistance with the external magnetic field.

The conventional material thus has a problem in that the sensitivity of resistance changes with an external magnetic field is significantly low.

SUMMARY OF THE INVENTION

The present invention has been achieved for solving the above problems, and an object of the present invention is to permit achievement of a giant magnetoresistive effect by granular GMR material effect even if the content of a ferromagnetic metal is increased so as to obtain a higher GMR effect with higher sensitivity, and to improve MR characteristics in a low magnetic field by removing the effect of crystal magnetic anisotropy of the ferromagnetic metal.

In order to achieve the object, in one aspect of the present invention, there are provided magnetoresistive materials having a structure in which many clusters having a grain size of 20 nm or less and comprising an amorphous phase containing at least one ferromagnetic metal element T selected from Fe, Co and Ni as a main component, and at least one element M selected from Ti, Zr, Hf, V, Nb, Ta, Mo and W are surrounded by a Cu and/or Ag crystal phase.

In the present invention, the magnetoresistive materials preferably have the following composition:

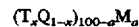

$(T_xQ_{1-x})_{100-a}M_a$ wherein T indicates at least one ferromagnetic metal element selected from Fe, Co and Ni;

Q indicates Cu and/or Ag;

M indicates at least one element selected from Ti, Zr, Hf, V, Nb, Ta, Mo and W; and the composition ratios respectively satisfy the following relations:

$0.2 \leq x \leq 0.9$ (x is a value obtained by dividing the content of element T by the total amount of elements T and Q)

$0.5 \leq a \leq 8$ (a is by atomic %).

In another aspect of the present invention, there is provided a magnetoresistive multilayer film comprising thin films of a magnetoresistive material, and films of Cu and/or Ag, the two types of films being alternatively laminated.

BRIEF DESCRIPTION OF THE DRAWINGS

FIG. 1 is a schematic drawing illustrating the texture state of a magnetoresistive material of the present invention;

DETAILED DESCRIPTION OF THE PREFERRED EMBODIMENTS

Figure 2A:
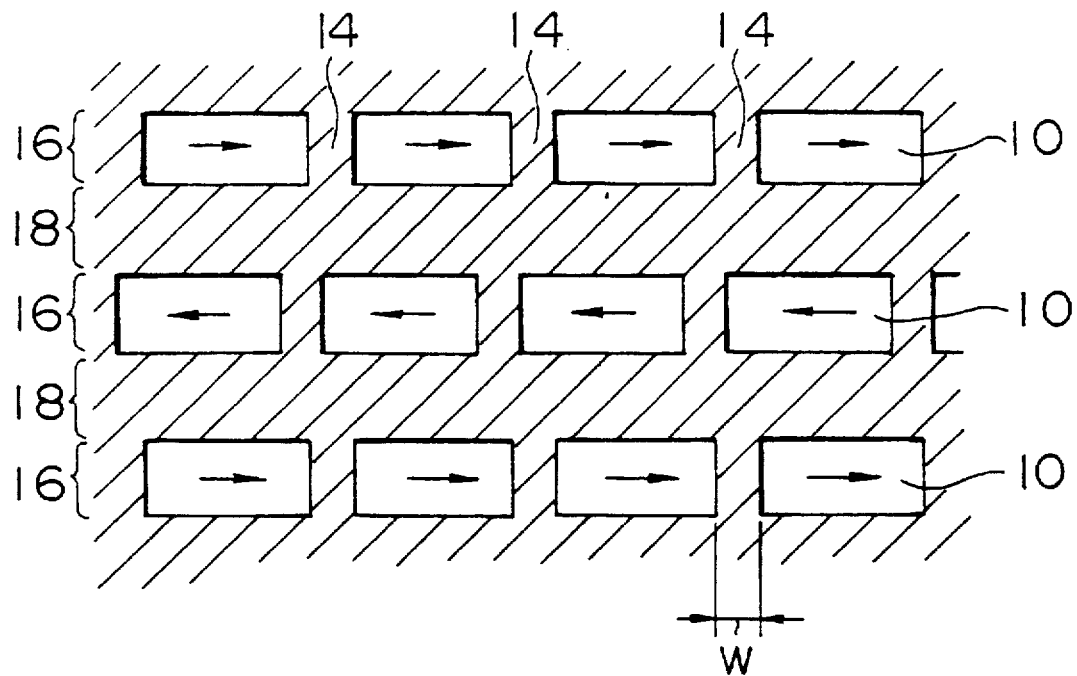
FIGS. 2A an 2B are schematic sectional views each illustrating a magnetoresistive material of the present invention.

The present invention is described in detail below. FIG. 1 is a schematic drawing illustrating the texture state of an example of magnetoresistive materials of the present invention. In FIG. 1, reference numeral 1 denotes an amorphous phase, and reference numeral 2 denotes a crystal phase.

Magnetoresistive materials of the present invention have a structure in which fine clusters comprising the amorphous phase 1 are surrounded by the crystal phase 2, as shown in FIG. 1. The amorphous phase 1 contains ferromagnetic metal element T (Fe, Co or Ni) as a main component, and element M (Ti, Zr, Hf, V, Nb, Ta, Mo or W). The crystal phase 2 comprises Cu, Ag or an alloy thereof as a main component, and trace amounts of elements T and M.

Each of the magnetoresistive materials of the present invention can be deposited on a cooled substrate to form an alloy thin film by using a thin film deposition apparatus which employs a general-purpose technique such as sputtering or vapor deposition. As the film deposition apparatus, for example, a radio-frequency double pole sputtering apparatus, a DC sputtering apparatus, a magnetron sputtering apparatus, a three-pole sputtering apparatus, an ion beam sputtering apparatus, an opposed target sputtering apparatus can be employed. A composite target can be used as a sputtering target in which chips of Cu, Ag, Zr, Hf or Ta are arranged on a Co or Ni—Fe—Co alloy target. The thin film formed is preferably annealed.

The magnetoresistive materials of the present invention can be represented by $(T_xQ_{1-x})_{100-a}M_a$ wherein T indicates at least one ferromagnetic metal element selected from Fe, Co and Ni; Q indicates Cu and/or Ag; and M indicates at least one element selected from Ti, Zr, Hf, V, Nb, Ta, Mo and W.

Element M of the magnetoresistive materials of the present invention has the ability to form an amorphous phase, and is capable of rendering amorphous a ferromagnetic metal even in a composition having a high content of ferromagnetic metal element T and forming fine clusters having a grain size of 20 nm or less.

Therefore, even in a composition having a high ferromagnetic metal content which makes it impossible to obtain the giant magnetoresistive effect due to an increase in the size of crystal grains, the giant magnetoresistive effect can be obtained due to the fine amorphous clusters comprising a ferromagnetic metal.

Since it is possible to form the fine amorphous clusters in a composition having a high ferromagnetic metal content, the distance between the respective ferromagnetic amorphous clusters with the crystal phase of a nonmagnetic metal (Cu or Ag) therebetween is decreased, thereby causing coupling such as weak static magnetic interaction between the respective ferromagnetic amorphous clusters. This can decrease the large magnetic field generally required for reversal of magnetization.

Further, since the amorphous clusters are formed without crystallization of the ferromagnetic metal element, the magnetization process of the ferromagnetic amorphous clusters is related to MR characteristics. Since the ferromagnetic amorphous clusters have no crystal magnetic anisotropy, free rotation of magnetization is possible, and MR characteristics in a low magnetic field are improved, in comparison with conventional materials.

As a result of measurement of alloys used as the magnetoresistive materials of the present invention represented by $(T_xQ_{1-x})_{100-a}M_a$ with respect to the rate of change in resistance with composition ratio x of a ferromagnetic metal, it was found that composition ratio x has an optimum range (the range where the rate of change in resistance increases to some extent), which is preferably 0.2 to 0.9, and more preferably 0.4 to 0.8.

As described above, element M has the function to form the amorphous clusters comprising a ferromagnetic metal when added to the element M, and makes it possible to obtain the giant magnetoresistive effect even with a composition having a high ferromagnetic metal content. However, a probability that conduction electrons are scattered by element M as an impurity is increased.

Therefore, with element M at low composition ratio a, the giant magnetoresistive effect cannot be obtained with a composition comprising a ferromagnetic metal within a high content range, as with conventional materials such as Cu—Co alloys or the like. If the composition ratio a is excessively high, the flow of conduction electrons which contribute to the magnetoresistive effect is inhibited, thereby decreasing the rate of change in resistance.

In order to maintain the rate of change in resistance at a level of 2% or more, composition ratio a is preferably 0.5 to 8.

The composition ratio a is more preferably 1 to 6 in order to maintain the rate of change in resistance at a level of about 4% or more.

Since the magnetoresistive materials of the present invention have the above-described specified composition, particularly, element M (Ti, Zr, Hf, V, Nb, Ta, Mo or W) having the high ability to form an amorphous phase, the amorphous clusters comprising Fe, Co or Ni as a main component are formed.

The present invention in which a nonmagnetic metal (Cu or Ag) is precipitated in a network form around the fine amorphous clusters comprising a ferromagnetic element such as Co, Fe or the like as a main component enables the achievement of the giant magnetoresistive effect in an alloy system having a composition with a high Co or Fe content in which the ferromagnetic grains cannot be easily micronized in a conventional material. The present invention also improves low-magnetic-field MR characteristics by removing the effect of crystal magnetic anisotropy of the ferromagnetic grains, which causes a problem with a conventional material.

The texture state of an actual material can be observed by a transmission electron microscope (TEM).

Figure 11:
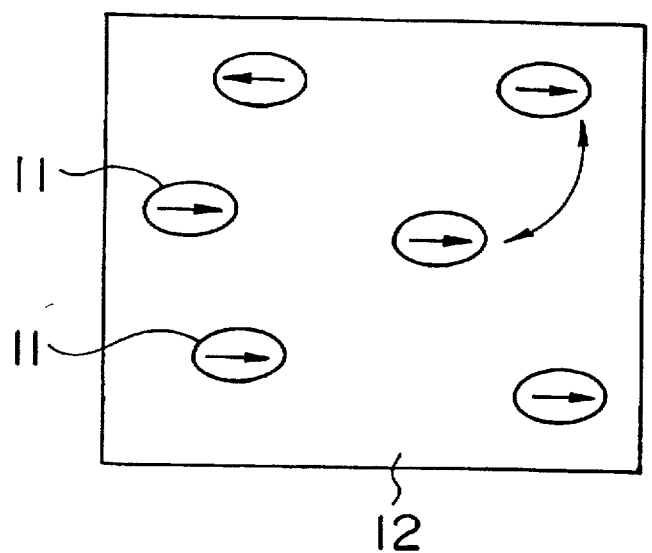
FIG. 11 is a schematic drawing illustrating a texture state of a conventional material.

Since a conventional granular GMR material contains a nonmagnetic metal (Cu, Ag or the like) at a high content, ferromagnetic grains 11 in a Cu (Ag) matrix 12 are spaced at large distances, and magnetic (dipole) interaction therebetween hardly acts (shown in FIG. 11). There are thus only a few combinations in which the directions of magnetization of the adjacent grains are antiparallel without an external magnetic field. Even if the shape of the grains is made flat or elliptical by heat treatment in a magnetic field or tension annealing, only the effect of decreasing diamagnetic field of the grains (improving the MR dependence on magnetic field) is improved, and the MR ratio is hardly improved. This is because resistance is higher in an arrangement in which the directions of magnetization of adjacent grains are antiparallel.

However, since the materials of the present invention contain a ferromagnetic metal element at a high content, the amorphous clusters comprising the ferromagnetic metal element are spaced at short distances, and (dipole) static magnetic interaction thus acts between the clusters, thereby causing some degree of weak bonding therebetween. The magnetoresistive materials of the present invention thus exhibit less superparamagnetic behavior, the improved dependence on magnetic fields, and changes in magnetoresistance with good sensitivity.

A magnetoresistive multilayer film of the present invention will now be described.

Figure 2B:
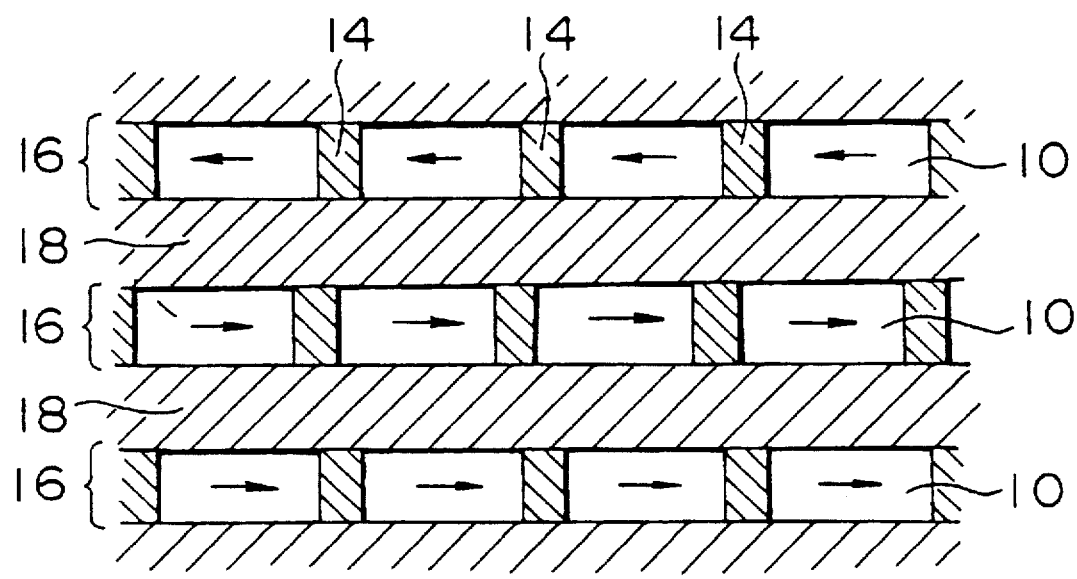

Referring to FIGS. 2A and 2B, the magnetoresistive multilayer film of the present invention comprises thin films 16, each comprising a magnetoresistive material consisting of the above-described ferromagnetic amorphous clusters 10 and Au or Ag precipitates 14 around the clusters; and nonmagnetic thin films 18, each comprising Cu and/or Ag; the two types of films 16 and 18 being alternately laminated.

FIG. 2A shows a film in which each of the nonmagnetic thin films 18 comprises the same material as the precipitates produced around the ferromagnetic amorphous clusters 10, and FIG. 2B shows a film in which each of the nonmagnetic thin films 18 comprises a material different from the precipitates produced around the ferromagnetic amorphous clusters 10.

Such multilayer film structures permit the formation of the ferromagnetic amorphous clusters in a flat phase comprising Co(—Fe, —Ni)-M, and simplifies static magnetic interaction acting to cause antiparallel magnetization directions of the adjacent ferromagnetic amorphous clusters, thereby facilitating the interaction. It is thus possible to efficiently realize antiparallel directions of magnetization, improve the MR ratio and response (sensitivity) of the MR material to a magnetic field in the direction of the film plane, and stabilize the MR characteristics.

A more preferable structure is the structure shown in FIG. 2B in which the magnetoresistive material thin films 16 each comprise the Ag precipitates 14 produced around the amorphous clusters 10 consisting of the main component Co, and the nonmagnetic thin films 18 consisting of Cu are interposed between the respective thin films 16. This structure permits the formation of a network Ag crystal phase around the Co-based amorphous clusters 10 because Ag and Co have a strong tendency of phase separation, and the formation of a magnetoresistive multilayer film having excellent characteristics because a combination of Cu and Co exhibits the large GMR effect.

In such a multilayer film, the thin films 16 comprising a magnetoresistive material preferably have a thickness within the range of 0.7 to 20 nm, and the nonmagnetic thin films 18 interposed between the respective thin films 16 preferably have a thickness of within the range of 1.0 to 10 nm.

If the thin films 16 comprising a magnetoresistive material have a thickness of less than 0.7 nm, the ferromagnetic properties of the amorphous clusters 10 cannot be easily maintained. If the thickness is over 20 nm, since a plurality of amorphous clusters 10 are formed in the same layer and overlapped each other in the direction of the thickness thereof, the characteristics of the multilayer film become similar to those of a single layer film, thereby interfering with the effect of improving MR characteristics of the multilayer structure.

If the thickness of the nonmagnetic metal thin films 18 is less than 1.5 nm, the exchange interaction between the respective magnetoresistive material thin films 16 exhibiting ferromagnetic properties is enhanced, thereby causing difficulties in an action in a low magnetic field, i.e., necessitating a strong magnetic field for a change in resistance. If the thickness is over 10 nm, there is an increase in the probability that conduction electrons pass through the nonmagnetic thin films 18 having high conductivity without being scattered in the interfaces between the magnetoresistive material thin films 16 and the nonmagnetic thin films 18. Namely, the ratio of electrons which do not contribute to the GMR effect is increased, and the magnetoresistive effect is decreased.

The distances (denoted by w in FIG. 2A) between the respective amorphous clusters 10 in each of the magnetoresistive material thin films 16 are preferably within the range of 0.3 to 10 nm.

If the distances between the respective amorphous clusters are less than 0.3 nm, direct exchange coupling between the respective amorphous clusters cannot be cut 16 off. In this case, the magnetoresistive material thin films 16 consequently behave as thin films in which the ferromagnetic amorphous clusters are continued. If the distances are over 10 nm, there is an increase in the probability that the relative positional relation of the clusters 10 in the adjacent magnetoresistive material thin films 16 with the nonmagnetic thin film 18 therebetween is deviated. This is undesirable for effectively achieving static magnetic coupling of the amorphous clusters 10 in the adjacent magnetoresistive material thin films 16 with the nonmagnetic thin films 18 therebetween.

Figure 3:
FIG. 3 is a transmission electron microscope photograph of an example of magnetoresistive materials of the present invention.

FIG. 3 is a transmission electron microscope (TEM) photograph of an alloy thin film having the composition $Co_{71.2}Ag_{24.5}Hf_{4.3}$ corresponding to the magnetoresistive materials of the present invention.

The alloy thin film tested was formed by using a radio-frequency double-pole sputtering apparatus under conditions in that the radio-frequency input was $2.4 \times 10^4$ W/m², the Ar gas pressure was 5 mTorr, a substrate was cooled with water during film formation. The film formed was then annealed at 400° C. for 1 hour.

In this thin film, many amorphous clusters of about 10 nm or less, which are surrounded by a crystal phase, were observed.

As a result of EDS analysis (energy dispersive characteristic X-ray spectroscopic analysis), it was found that the amorphous clusters comprise a Co-rich phase, which is probably a Co—Hf alloy consisting of Co as a main component, and that the crystal phase comprises an Ag-rich phase, which is probably a Ag—Co—Hf alloy consisting of Ag as a main component.

Figure 4:
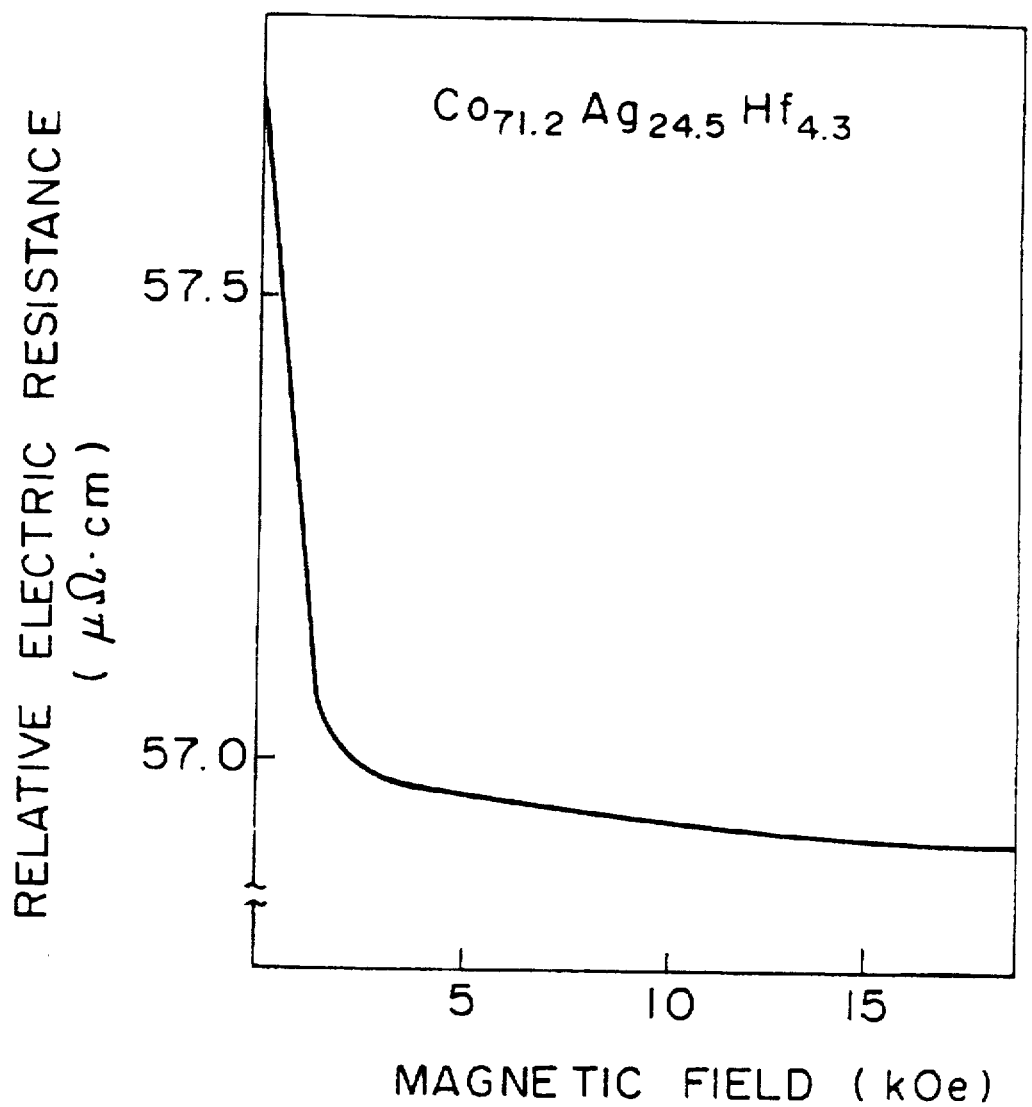
FIG. 4 is a graph showing a magnetic resistance curve obtained in an example of the present invention.

The alloy thin film of $Co_{71.2}Ag_{24.5}Hf_{4.3}$ was measured with respect to changes in magnetoresistance with external magnetic fields. The results obtained are shown in FIG. 4.

Figure 5:
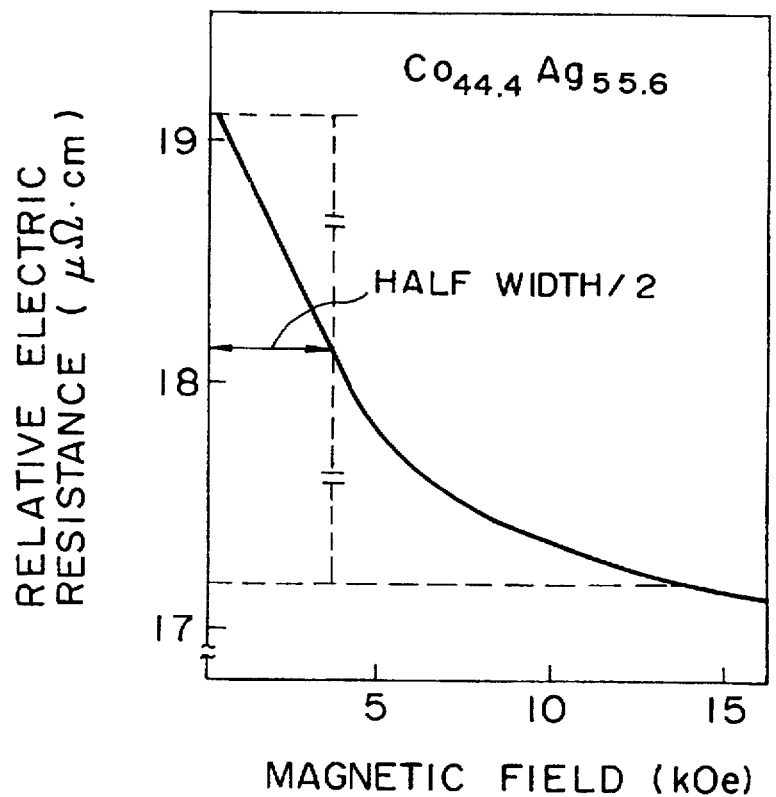
FIG. 5 is a graph showing a magnetic resistance curve obtained in a comparative example.
Figure 6:
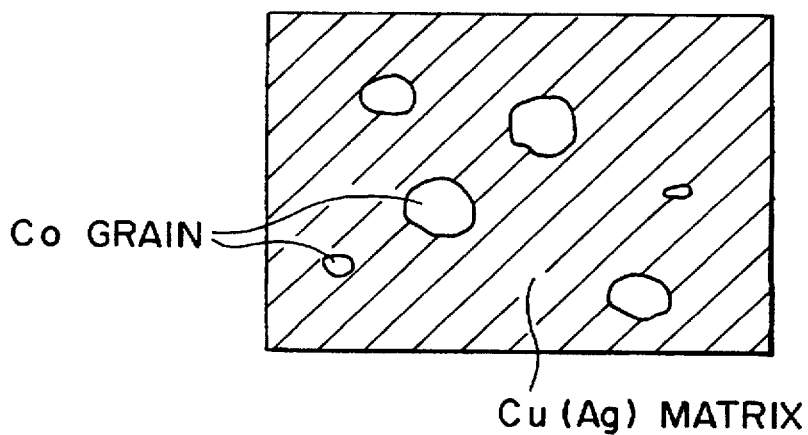
FIG. 6 is a schematic drawing illustrating a texture state of a conventional material.
Figure 7:
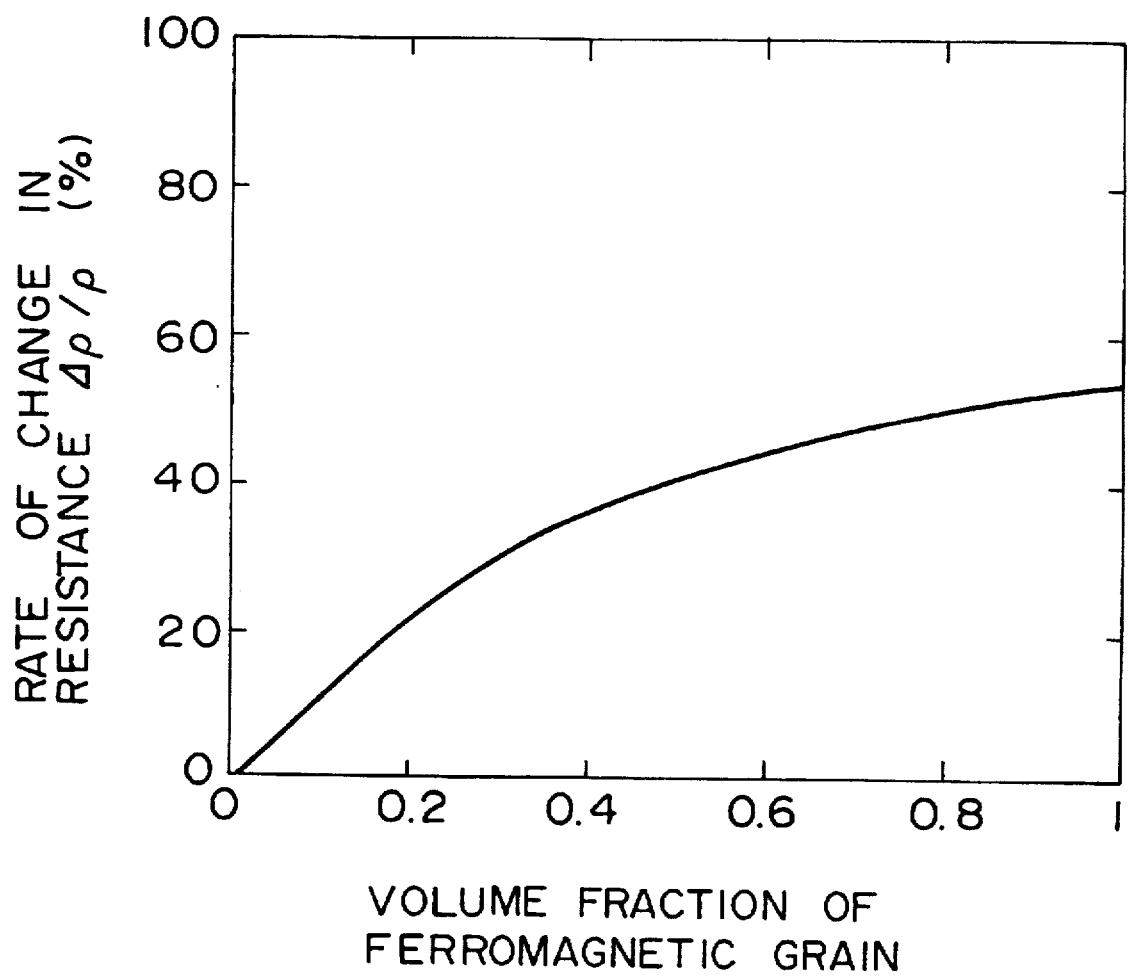
FIG. 7 is a graph showing a theoretical curve of the relation between the volume fraction and the rate of change in resistance of ferromagnetic grains.
Figure 8:
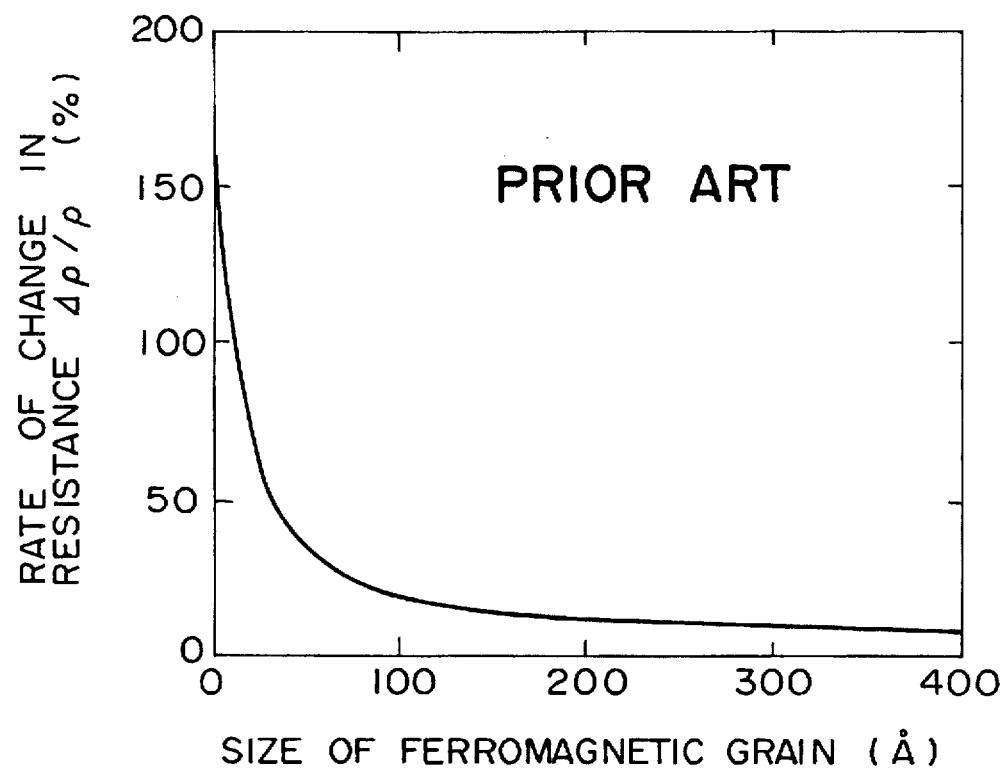
FIG. 8 is a graph showing a theoretical curve of the relation between the grain size and the rate of change in resistance of ferromagnetic grains.
Figure 9:
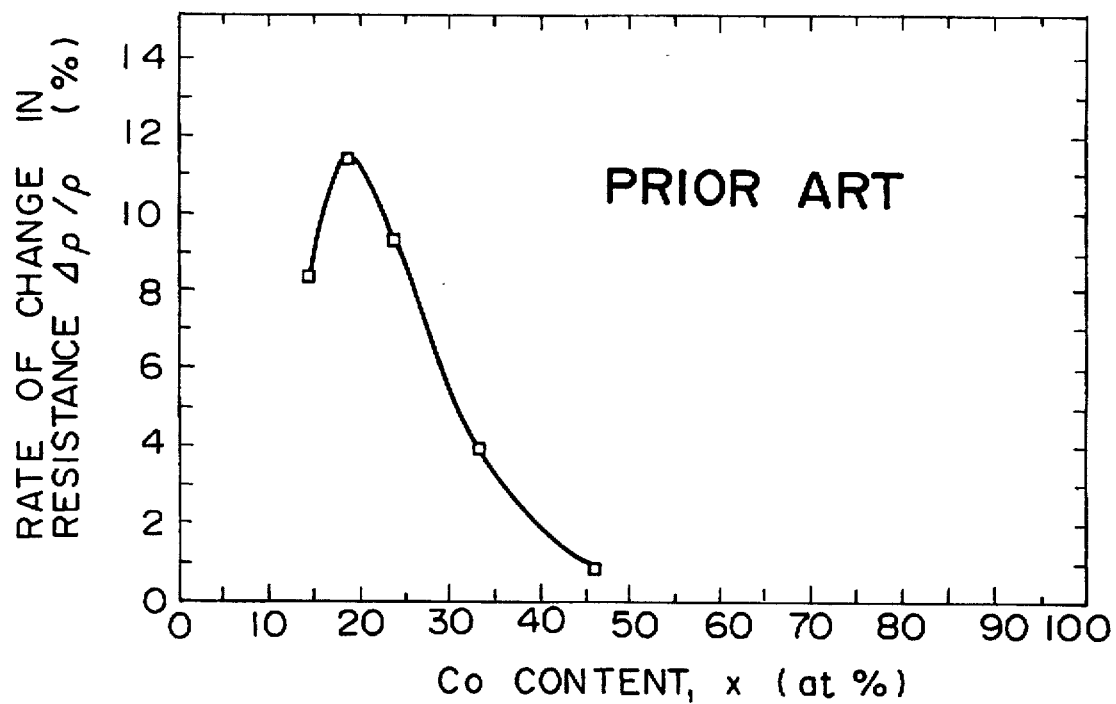
FIG. 9 is a graph showing the relation between the Co content and the rate of change in resistance of a conventional material.
Figure 10:
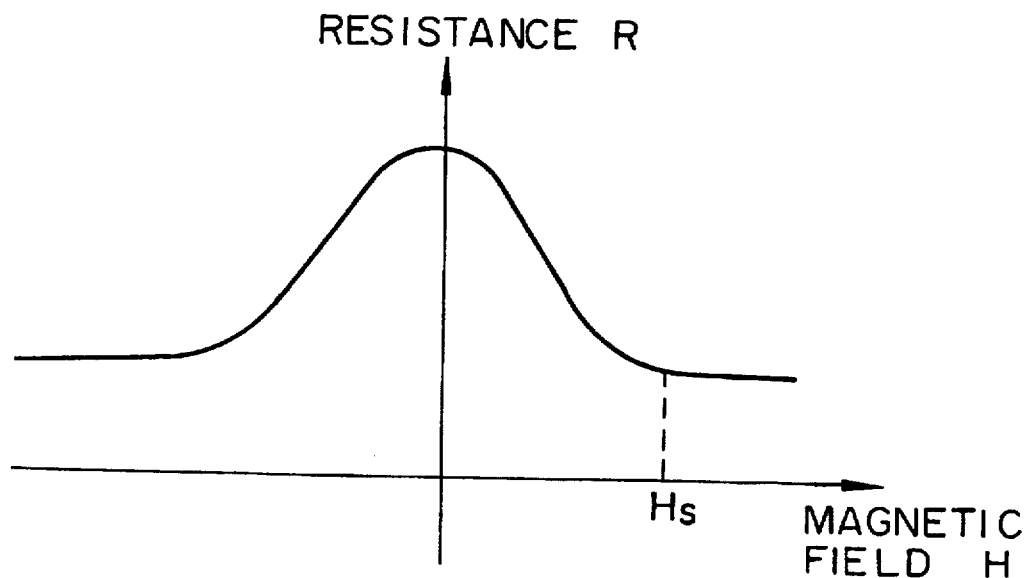
FIG. 10 is a graph showing the relation of magnetic field and resistance.

An alloy thin film of $Co_{71.2}Ag_{24.5}Hf_{4.3}$ was formed as a comparative example, and then measured with respect to changes in magnetoresistance with external magnetic fields. This alloy film of the comparative example was formed by using a composite target comprising a Co target and Ag chips arranged thereon, and a radio-frequency double-pole sputtering apparatus. The results obtained are shown in FIG. 5.

These results indicate that although the comparative example shows a magnetoresistance curve having a half width of about 7.1 kOe, the magnetoresistive material of the present invention shows a magnetoresistance curve having a half width of about 1.8 kOe, and is significantly improved in MR characteristics in a low magnetic field.

Since magnetoresistive materials used for magnetic heads and sensors are required to have soft magnetic characterstics from the viewpoint of sensitvity, it is obvious that the material of the present invention has excellent soft magnetic characteristics.

As described above, the magnetoresistive materials of the present invention have a structure in which many clusters having a grain size of 20 nm or less and comprising an amorphous phase containing at least one ferromagnetic metal element T selected from Fe, Co and Ni as a main component, and at least one element M selected from Ti, Zr, Hf, V, Nb, Ta, Mo and W are surrounded by a crystal phase of Cu and/or Ag.

The magnetoresistive materials in another embodiment of the present invention has the following composition:

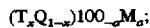

wherein T indicates at least one ferromagnetic metal element selected from Fe, Co and Ni;

Q indicates Cu and/or Ag;

M indicates at least one element selected from Ti, Zr, Hf, V, Nb, Ta, Mo and W; and the composition ratios respectively satisfy the following relations:

$0.2 \leq x \leq 0.9$ (x is a value obtained by dividing the content of element T by the total amount of content of elements T and Q)

$0.5 \leq a \leq 8$ (a is by atomic %).

The magnetoresistive materials of the present invention permit an increase in the content of the ferromagnetic metal element while maintaining the fine size of the ferromagnetic amorphous clusters consisting of Fe, Co or Ni as a main component, and exhibit the large magnetoresistive effect.

Since the amorphous clusters consisting of a ferromagnetic metal element as a main component have no crystal magnetic anisotropy, the magnetoresistive effect in a low magnetic field can be improved.

Therefore, it is possible to obtain a high-sensitivity magnetic head and magnetic sensor which produce high output at lower magnetic fields.

The magnetoresistive multilayer film of the present invention comprises thin films each comprising a magnetoresistive material of the present invention, and thin films comprising Cu and/or Ag, the two types of films being alternately laminated.

The magnetoresistive multilayer film of the present invention is capable of efficiently realizing antiparallel directions of magnetization, improving the MR ratio and response (sensitivity) of the MR material to a magnetic field in the direction of the film plane, and stabilizing the MR effect.

What is claimed is:

1. A magnetoresistive multilayer film comprising first thin films alternately laminated with second thin films, each of the first thin films comprising a magnetoresistive material having a structure in which a plurality of clusters are surrounded by a crystal phase including at least one of Cu and Ag, each of the clusters having a grain size of 20 nm or less and comprising an amorphous phase containing at least one ferromagnetic metal element T selected from the group consisting of Fe, Co and Ni, and at least one element M selected from the group consisting of Ti, Zr, Hf, V, Nb, Ta, Mo and W, each of the second thin films comprising at least one of Cu and Ag;

wherein each of the first thin films satisfies the following composition:

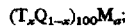

wherein Q indicates Cu and/or Ag; and wherein the composition satisfies the following relations:

$0.2 \leq x \leq 0.9$, where x is a value obtained by dividing a content of element T by a total amount of content of elements T and Q; and $0.5 \leq a \leq 8$, where a is in atomic %.

* * * * *